(12) United States Patent
Chen et al.

(10) Patent No.: US 7,470,619 B1
(45) Date of Patent: Dec. 30, 2008

(54) INTERCONNECT WITH HIGH ASPECT RATIO PLUGGED VIAS

(75) Inventors: Mary Y. Chen, Oak Park, CA (US); James Chingwei Li, Simi Valley, CA (US); Philip H. Lawyer, Thousand Oaks, CA (US); Marko Sokolich, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 18 days.

(21) Appl. No.: 11/607,494

(22) Filed: Dec. 1, 2006

(51) Int. Cl.
*H01L 21/44* (2006.01)
*H01L 21/4763* (2006.01)

(52) U.S. Cl. ............... 438/675; 438/618; 438/631; 438/652; 438/674; 438/678; 257/E23.141; 257/E21.175; 257/E21.586

(58) Field of Classification Search .......... 438/618, 438/621, 652, 674, 678; 257/E21.175, E23.021, 257/E21.586
See application file for complete search history.

(56) References Cited

U.S. PATENT DOCUMENTS

| | | | |
|---|---|---|---|
| 6,448,171 B1* | 9/2002 | Wang et al. | 438/614 |
| 2003/0178666 A1* | 9/2003 | Lee et al. | 257/306 |
| 2007/0052101 A1* | 3/2007 | Usami | 257/758 |
| 2008/0075836 A1* | 3/2008 | Chen et al. | 427/58 |

OTHER PUBLICATIONS

Shigeki Wada, et al., "0.2um Fully-Aligned Y-shaped gate HJFET's with reduced gate-fringing capacitance fabricated using collimated sputtering and electroless Au-plating," IEEE Transactions on Electron Devices, vol. 45, No. 8, Aug. 1998, pp. 1656-1662.
M.Y. Chan and T.C. Lo. "Electrochemical planarization by selective electroplating for embedded gold wiring in the sub-micron range," 1995 IEEE Region 10 International Conference on Microelectronics and VLSI, pp. 287-290.
M. Hirano, et al., "Submicrometer Gold Interconnect wiring by sidewall electroplating technology," Jpn J. Apply. Phys. 33, 1994, L553-L555.

* cited by examiner

*Primary Examiner*—George Fourson
*Assistant Examiner*—Phillip Green
(74) *Attorney, Agent, or Firm*—Tope Mckay & Associates

(57) ABSTRACT

Described is a method for forming a stackable interconnect. The interconnect is formed by depositing a first contact on a substrate; depositing a seed layer (SL) on the substrate; depositing a metal mask layer (MML) on the SL; depositing a bottom anti-reflection coating (BARC) on the MML; forming a photoresist layer (PR) on the BARC; removing a portion of the PR; etching the BARC and the MML to expose the SL; plating the exposed SL to form a first plated plug; removing the layers to expose the SL; removing an unplated portion of the SL; depositing an inter layer dielectric (ILD) on the interconnect; etching back the ILD to expose the first plated plug; and depositing a second contact on the first plated plug. Using the procedures described above, a second plated plug is then formed on the first plated plug to form the stackable plugged via interconnect.

30 Claims, 16 Drawing Sheets

INTERCONNECT WITH HIGH ASPECT RATIO PLUGGED VIAS

STATEMENT OF GOVERNMENT RIGHTS

The present invention relates to work performed in contract with the U.S. Government in its Technology for Frequency Agile Digitally Synthesized Transmitters (TFAST) program, under Air Force Research Laboratory (AFRL) contract number F33615-02-1286, where the U.S. Government may have certain rights in this invention, and the contractor has elected to retain title.

FIELD OF INVENTION

The present invention relates to integrated circuit (IC) via, and more particularly, to plug-type via with a high-aspect ratio for a III-V compound semiconductor with high-speed IC multi-level interconnect.

BACKGROUND OF INVENTION

Integrated circuits (ICs) are small electronic components that are made out of semiconductor materials, metals, and dielectrics. To route an electrical signal, ICs typically use interconnects and vias. The IC industry has developed various interconnect technologies with high aspect-ratio filled plugs, including stacked via, for advanced multi-level IC processing. Such technologies include dual-damascene on an inter-layer dielectric (ILD), various metallization processes, chemical and physical vapor deposition (CVD/PVD), copper plating, and chemical-mechanical polishing (CMP) of interconnect metal.

Additionally, several specific techniques have been described for generating high aspect-ratio interconnects in III-V compound semiconductor ICs. Such techniques were described by Shigeki Wada et al., in a publication entitled, "0.2 μm Fully-Aligned Y-Shaped gate HJFET's with Reduced Gate-Fringing Capacitance Fabricated Using Collimated Sputtering and Electroless Au-Plating," in IEEE Transactions on Electron Devices, vol. 45, no. 8, August, 1998, pp. 1656-1662. Another technique is described by M. Y. Chan and T. C. Lo, in a publication entitled, "Electrochemical Planarization By Selective Electroplating For Embedded Gold Wiring In The Sub-Micron Range," in IEEE Region 10 International Conference on Microelectronics and VLSI, pp. 287-290, 1995. Yet another technique was described by M. Hirano et al., in a publication entitled, "Submicrometer Gold Interconnect Wiring by Sidewall Electroplating Technology," in Jpn J. Apply. Phys. 33, 1994, L553-L555.

The first two papers have several features in common. More specifically, they describe etching into $SiO_2$ to form a trench for areas needed to be plated up. They also both describe plating a seed layer and trench filling with a photoresist, followed by etch-back to remove or oxidize the seed layer outside of the trenches. Finally, they describe photoresist removal and gold (Au) plating.

The paper by Shigeki Wada et al., about the 0.2 μm Y-shaped gate plating process, describes forming the lower part of the Y such that it is narrow with an aspect ratio of 1:1 (deposition of the seed layer depends on a special sputtering system with 2:1 collimating tubes). The upper part of the Y-shape plated gate is curved (or bent) laterally as the result from the shape of the seed layer after its etch-back (after photoresist is used to fill the trench). Although it is fitted well for Y-shaped gates, such a shape is not sufficient (with respect to dimension control and aspect ratio) in via for interconnects in high density and complex ICs.

The second paper, by M. Y. Chan and T. C. Lo, describes a process that depends on controlling the removal of a top seed layer and passivation (oxidation) of the seed metal surface to define areas for plating. The authors also indicated that thoroughly removing the filled photoresist in the trench after the oxidization, before plating, is also crucial.

The third paper, by M. Hirano et al., describes a copper plug-like process employing electrochemical planarization. As described, the seed layer is grown on the inside and outside of trenches to follow the contour of the trenches. The seed layer is plated to reach above the top of the trenches. The "over-plated" trenches are then removed by electrochemical planarization. While operational as via interconnect, such trenches do not provide for stacking, as multiple stacked layers would become increasingly large in size.

Plating into a trenched via formed by an interlayer dielectric (ILD) etch is a typical interconnect technology that is used in III-V compound semiconductor ICs. Such interconnects usually consume more area than designers prefer and can be a limiting factor in performance of complex ICs with advanced devices. The differences in interconnect technology can be crucial because interconnect technology with low parasitic values and high density values is necessary for a high-speed, low power IC. However, in III-V compound semiconductor ICs, high-speed scaled device performance has been significantly improved. Nevertheless, old interconnect technology remains, unlike in SiGe hetero-junction bipolar transistor-based (HBT-based) IC technology. High performance InP-based HBTs are known to have great advantages in high-speed IC applications. However, more compact circuits with less parasitics can save more power, especially in complex circuits.

For example, via plugs with a high aspect ratio can lower via and interconnect resistance, and increase current density, especially for scaled (into sub-micron region) vias. As described above, typical existing IC technology uses a trench style via to connect interconnect metal layers.

Typical steps for plating of trenched via are shown in FIGS. 1-3. As shown in FIG. 1, trenches are first formed by Inductance Coupled Plasma (ICP) etching the ILD to expose metal contacts where interconnects are needed. Then, a seed layer for electroplating is deposited. As shown in FIG. 2, the trench is plated to form the plated via. The sidewall of the trenched via has a sloped profile (instead of vertical) as a result of the ICP etch. The sloped trench causes the via to have a wider top than bottom and decreases the aspect-ratio of plated via. As shown FIG. 3, the photoresist is removed to expose the top of the plated via. As evident in the figures, the sloped trench causes a dent on top of the plated feature, which is not planarized enough for building another via on top of it with tight control of dimension.

Thus, current trench style vias provide dimension aspect ratios (height to width of via) less than (<) or approximately equal to (~) 1. Such traditional via sidewalls curve near the top and the top becomes wider than its bottom. As discussed above, after plating, there is a dip on the top of via. Therefore, the upper level inter level dielectric layer cannot be truly planar near via regions. Because the planarization dielectric layer is only marginally planar, it is difficult to build a stacked via on an existing via with good dimensional control. The end results, beside extra acreage, are extra parasitics and lack of flexibility in circuit design, especially in complex ICs like direct digital synthesizers (DDSs), analog-to-digital converters (ADCs), and digital-to-analog converters (DACs).

Therefore, a continuing need exits for smaller interconnects that feature dimension control (higher aspect-ratio) and the capability of using stacked via (with reduced acreage and parasitics) with additional interconnect levels for increasing circuit design.

SUMMARY OF INVENTION

The present invention relates to a method for forming an interconnect. The method comprises a plurality of acts. For example, the invention includes an act of depositing a first contact on a substrate. A seed layer is then deposited on the substrate such that it covers a portion of both the first contact and the substrate. A mask layer is thereafter deposited on the seed layer. A bottom anti-reflection coating (BARC) can then be deposited on the mask layer. A photoresist layer is then formed on the BARC. A portion of the photoresist layer is removed such that a gap exists above the first contact. At least a portion of the BARC and the mask layer are then removed to expose a portion of the seed layer on the first contact, the portion of the seed layer being an exposed seed layer. A first plated plug is then formed on the exposed seed layer, the first plated plug being formed to have a top portion. At least a portion of the photoresist layer, the BARC, and the mask layer are removed to expose an unplated portion of the seed layer. The unplated portion of the seed layer is thereafter removed. An inter layer dielectric (ILD) can then be deposited on the interconnect such that it covers at least a portion of the first plated plug, the first contact, and the substrate. At least a portion of the ILD is then removed to expose the top portion of the first plated plug. Finally, a second contact can then be formed on the top portion of the first plated plug, thereby forming an interconnect with a plated plug via.

In another aspect, the plated plug possesses a height and a width, with a height/width aspect ratio that is greater than two.

In yet another aspect, the photoresist layer is removed using optical lithography.

Additionally, in the act of forming a first plated plug on the exposed seed layer, the exposed seed layer is plated such that the plated plug has a width that is less than 0.3 microns. The plated plug is further formed such that it has a top portion separating two substantially parallel side walls.

In another aspect, the present invention further comprises an act of forming a second plated plug connected with the first plated plug. The method for forming the second plated plug is very similar to that described above regarding the first plated plug. More specifically, the act of forming the second plated plug further comprises acts of:

depositing a second seed layer such that it covers a portion of both the second contact and the ILD;
depositing a second mask layer on the second seed layer;
depositing a second bottom anti-reflection coating (BARC) on the second mask layer;
forming a second photoresist layer on the second BARC;
removing a portion of the second photoresist layer such that a gap exists above the second contact;
removing at least a portion of the second BARC and the second mask layer to expose a portion of the second seed layer on the second contact, the portion of the second seed layer being an exposed second seed layer;
forming a second plated plug on the exposed second seed layer, the second plated plug being formed to have a top portion;
removing at least a portion of the second photoresist layer, the second BARC, and the second mask layer to expose an unplated portion of the second seed layer; and
removing the unplated portion of the second seed layer,
depositing a second inter layer dielectric (second ILD) on the interconnect such that it covers at least a portion of the second plated plug and the second contact;
removing at least a portion of the second ILD to expose the top portion of the second plated plug; and
depositing a third contact on the top portion of the second plated plug, thereby forming a stacked interconnect with multiple levels of plated plug vias.

In yet another aspect, the present invention comprises an act of forming a second plated plug and a third plated plug, such that the second plated plug is electrically connected with and stacked on top of the first plated plug and the third plated plug is electrically separate from the first and second plated plugs. The act of forming the second plated plug and the third plated plug further comprises acts of:

depositing a third contact on the ILD such that the third contact is electrically separate from the second contact;
depositing a second seed layer such that it covers a portion of the second contact, the third contact, and the ILD;
depositing a second mask layer on the second seed layer;
depositing a second bottom anti-reflection coating (BARC) on the second mask layer;
forming a second photoresist layer on the second BARC;
removing a portion of the second photoresist layer such that a gap exists in the second photoresist layer above the second contact and the third contact;
removing at least a portion of the second BARC and the second mask layer to expose portions of the second seed layer on the second contact and on the third contact, the portion of the second seed layer that is exposed on the second contact being an exposed second contact seed layer, and the portion of the second seed layer that is exposed on the third contact being an exposed third contact seed layer;
forming a second plated plug and a third plated plug on the exposed second contact and exposed third contact seed layers, respectively, each of the second plated plug and the third plated plug having a top portion;
removing at least a portion of the second photoresist layer, the second BARC, and the second mask layer to expose an unplated portion of the second seed layer; and
removing the unplated portion of the second seed layer,
depositing a second inter layer dielectric (second ILD) on the interconnect such that it covers at least a portion of the second plated plug, the second contact, the third plated plug, and the third contact;
removing at least a portion of the second ILD to expose the top portions of each of the second plated plug and the third plated plug;
depositing a fourth contact on the top portion of the second plated plug;
depositing a fifth contact on the top portion of the third plated plug, thereby forming an interconnect with multiple levels of plated plug via.

Finally, as can be appreciated by one skilled in the art, the present invention also comprises an interconnect formed by the method described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
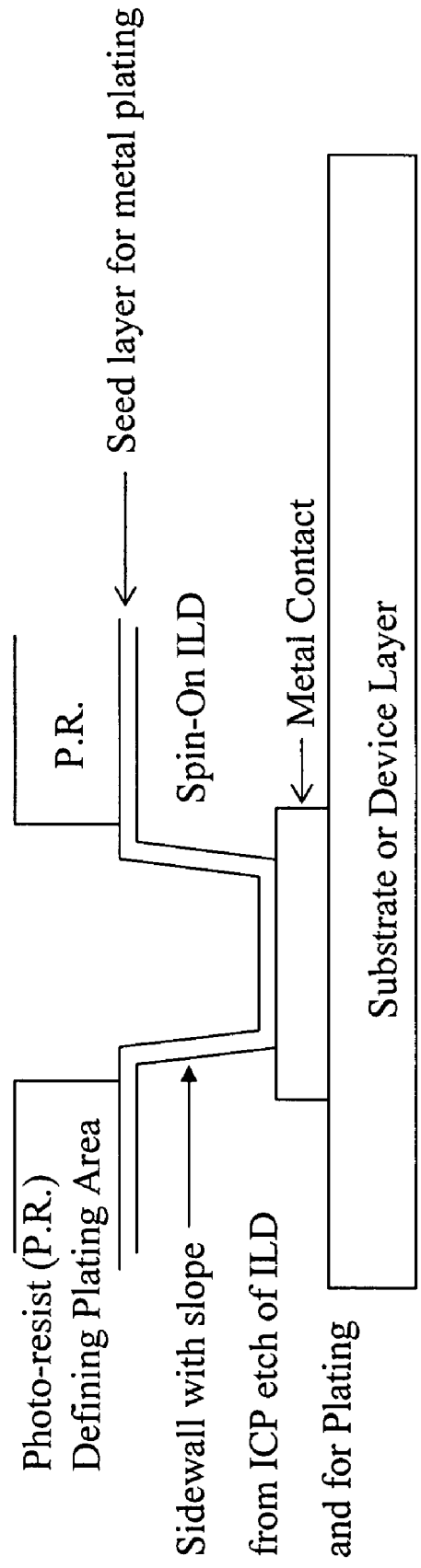
FIG. 1 is an illustration of the prior art, showing formation of a sloped trench.
Figure 2:
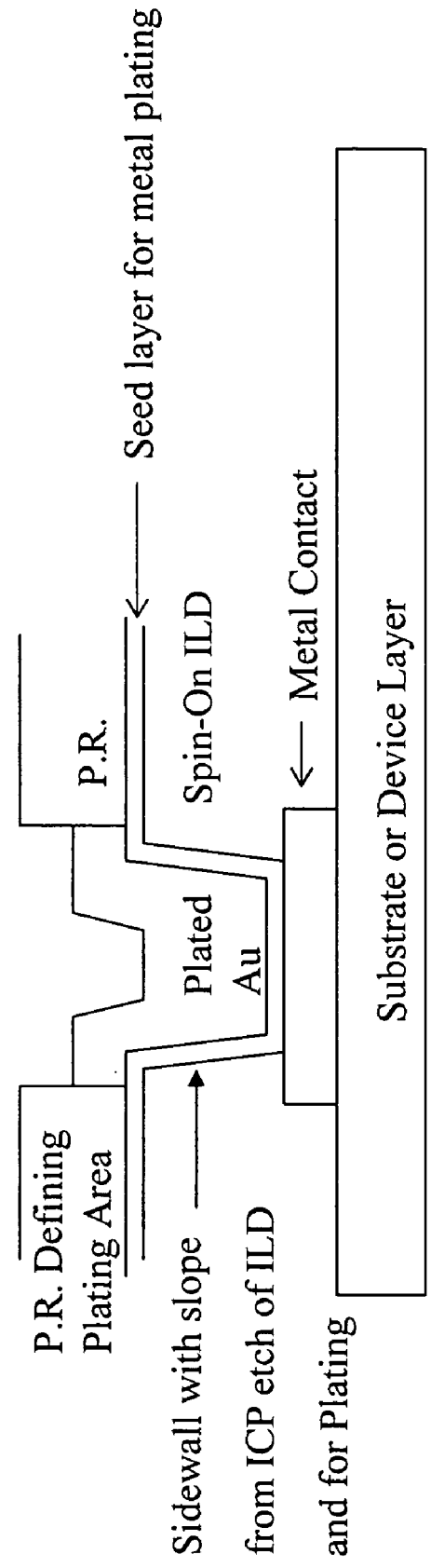
FIG. 2 is an illustration of the prior art, showing the sloped trench being plated to form a plated via having a sloped profile.
Figure 3:
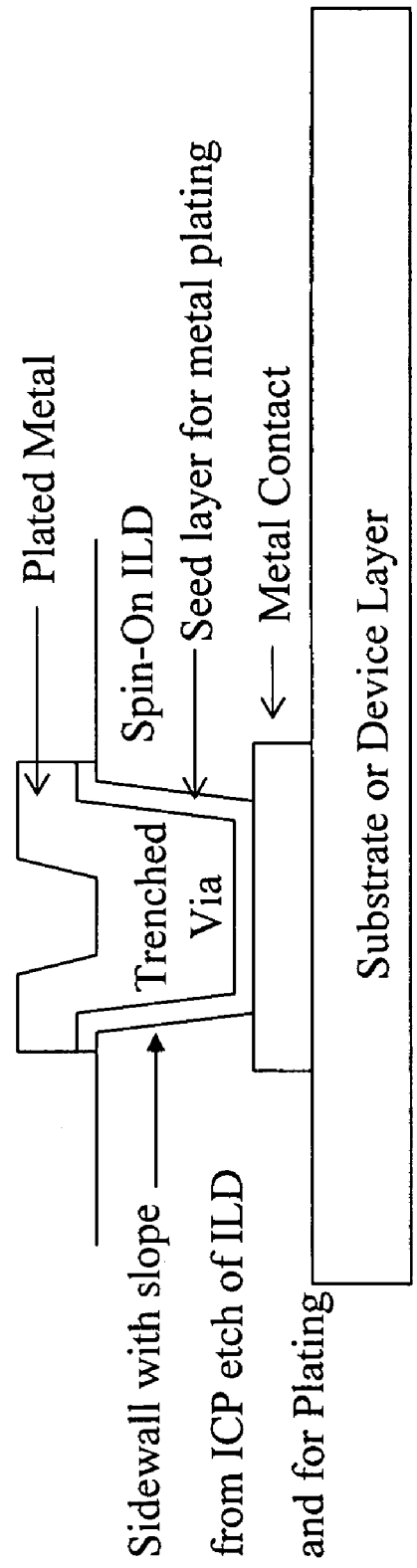
FIG. 3 is an illustration of the prior art, showing the finished plated via.

The present invention relates to via for an integrated circuit (IC), and more particularly, to plug-type via with a high-aspect ratio for III-V compound semiconductor high speed IC multi-level interconnect. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first an introduction provides the reader with a general understanding of the present invention. Finally, details of the present invention are provided to give an understanding of the specific aspects.

(1) INTRODUCTION

Conventional and traditional plating is performed by filling in trenched openings that are etched into an interlayer dielectric (ILD). Also, traditional plating depends either on defining the plating area by a photoresist/seed layer or surface treatment of the seed layer, as mentioned above. The present invention improves upon the prior art by first forming a via plug, spinning on the ILD, then etching back the ILD to expose the plugged via.

In the interconnect structure of the present invention, the plugged vias are first formed by plating. Then, an ILD (inter-layer dielectric) is deposited and etched back to expose the top of the plug via. The surface is planarized with micro-via connections and followed by metallization (creating a first level or bottom level interconnect) at the desired area. Another level of plugs (second plug level) can be formed above first level, followed by another level of ILD (second level) deposition. The second ILD level is then etched back to expose the top of the second plug level, and followed by the second level interconnect metal. The second level plugged via can be directly on top of the lower level (first level) plugged via to form a stacked via. This technology can be repeated as desired by IC designers for multi-level interconnect in any semiconductor material. It is particularly suitable in III-V compound semiconductor IC interconnect technology because of its low cost and low stress process.

It should be noted that process of plating the plug, then spinning on the ILD and thereafter etching it back to expose the top of the plugged via to form a high-aspect ratio via interconnect with a planarized surface has never been reported in the prior art. Thus, the present invention is a plug-type via with a high-aspect ratio for III-V compound semiconductor high-speed integrated circuit (IC), with multi-level interconnect technology. The plugged via can be used in next-generation interconnect technology, especially in complex ICs.

(2) DETAILS OF THE INVENTION

Figure 4:
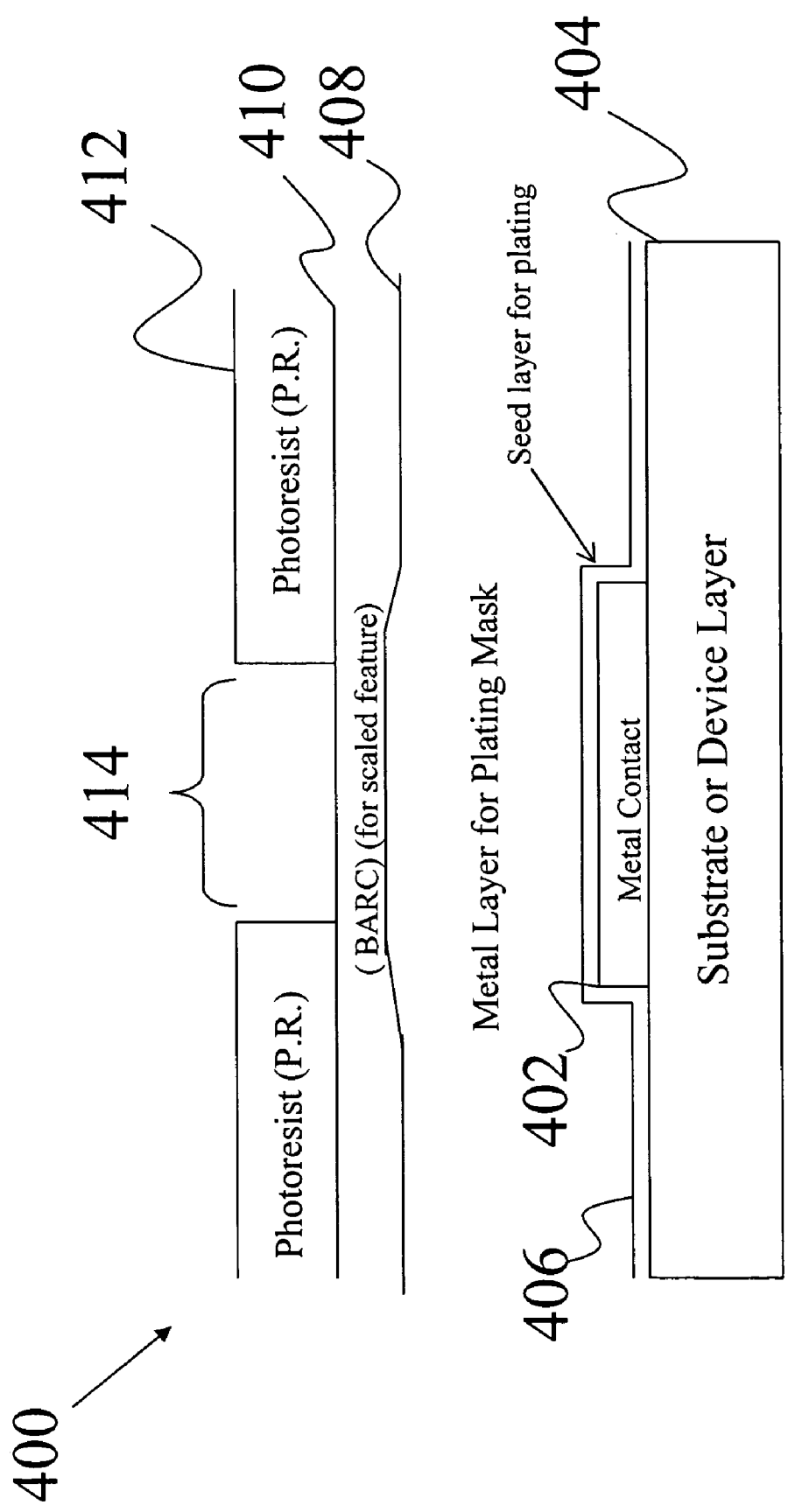
FIG. 4 is an illustration of an interconnect, illustrating the formation of the interconnect with a high-aspect ratio plugged via according to the present invention.

The present invention is related to interconnect with high-aspect ratio plugged via, and a method of forming the same. As shown in FIG. 4, the interconnect 400 is formed by first depositing a first contact 402 on a substrate 404. The contacts described herein are formed of any suitably conductive material, a non-limiting example of which includes metal, such as gold (Au). Additionally, the substrate 404 is any suitable substrate for use in an integrated circuit (IC), such as a non-conductive substrate or device layer. Further, the first contact 402 is formed using any suitable technique for depositing a contact on a substrate, a non-limiting example of which includes using optical lithography to define the patterns, using metal evaporation for metal deposition, and using lift-off to get rid of unwanted metal.

A seed layer 406 for electroplating is then deposited on the substrate 404 such that it covers a portion of both the first contact 402 and the substrate 404. As can be appreciated by one skilled in the art, the seed layer 406 can be deposited to cover the entire surface area of the first contact 402 and substrate 404, or alternatively, a smaller portion. The seed layer 406 is formed of any material that is suitable for electroplating. For example, the seed layer 406 can be formed of Ti/Pt/Au or Ti/W/Au, with Ti at bottom for good adhesion. The Pt or W can be used as a barrier layer (W can provide increased reliability) with Au for Au plating. The seed layer 406 can be deposited using any suitable deposition technique, a non-limiting example of which includes being deposited by sputtering for good coverage.

A metal mask layer 408 is then deposited on the seed layer 406. The metal mask layer 408 is deposited on the seed layer 406 using any suitable technique for depositing a metal mask layer, a non-limiting example of which includes depositing the metal by evaporation, patterning by optical lithography, and ICP etching. The metal mask layer 408 serves as a plating mask for use when plating the via. As opposed to other technologies, the metal mask layer 408 is formed of a conductive material, such as Titanium (Ti).

Next, a bottom anti-reflection coating (BARC) 410 is deposited on the metal mask layer 408 using any suitable technique for depositing a coating on a metal mask layer, a non-limiting example of which includes using a track system, similar to that used in coating a photoresist. The BARC 410 is used to scale the interconnect, as described in further detail below. The BARC 410 is any suitable anti-reflection coating, a non-limiting example of which includes XHRIC-16, produced by Brewer Science, Inc. Brewer Science, Inc. is located at 2401 Brewer Dr., Rolla, Mo. 65401. Deposition of the BARC 410 can be skipped if the interconnect is not to be scaled.

A photoresist layer 412 is then formed on the BARC 410 (or on the metal mask layer 408 in non-scaled aspects). The photoresist layer 412 is formed using any suitable technique for forming a photoresist layer, a non-limiting example of which includes using a photoresist track system. The photoresist layer 412 is a light-sensitive material, non-limiting examples of which include SPR-955 and Ultra 1 (123 or 122). Both SPR-955 and Ultra I are produced by Clariant Corporation, located in Charlotte, N.C., 28205.

Using a photoresist defining technique, such as optical lithography, a portion of the photoresist layer 412 is removed such that a gap 414 exists above the first contact 402. The photoresist layer 412 can be removed using a photoresist stripper (in case of a re-work or after plating is finished). Candidates of materials to define areas (i.e., the gap 414) for plated plug vias are not limited to dielectric layers, such as photoresist layers, they can, for example, be metal (e.g., Ti) (especially when plated plugs are of sub-micron dimensions).

Figure 5:
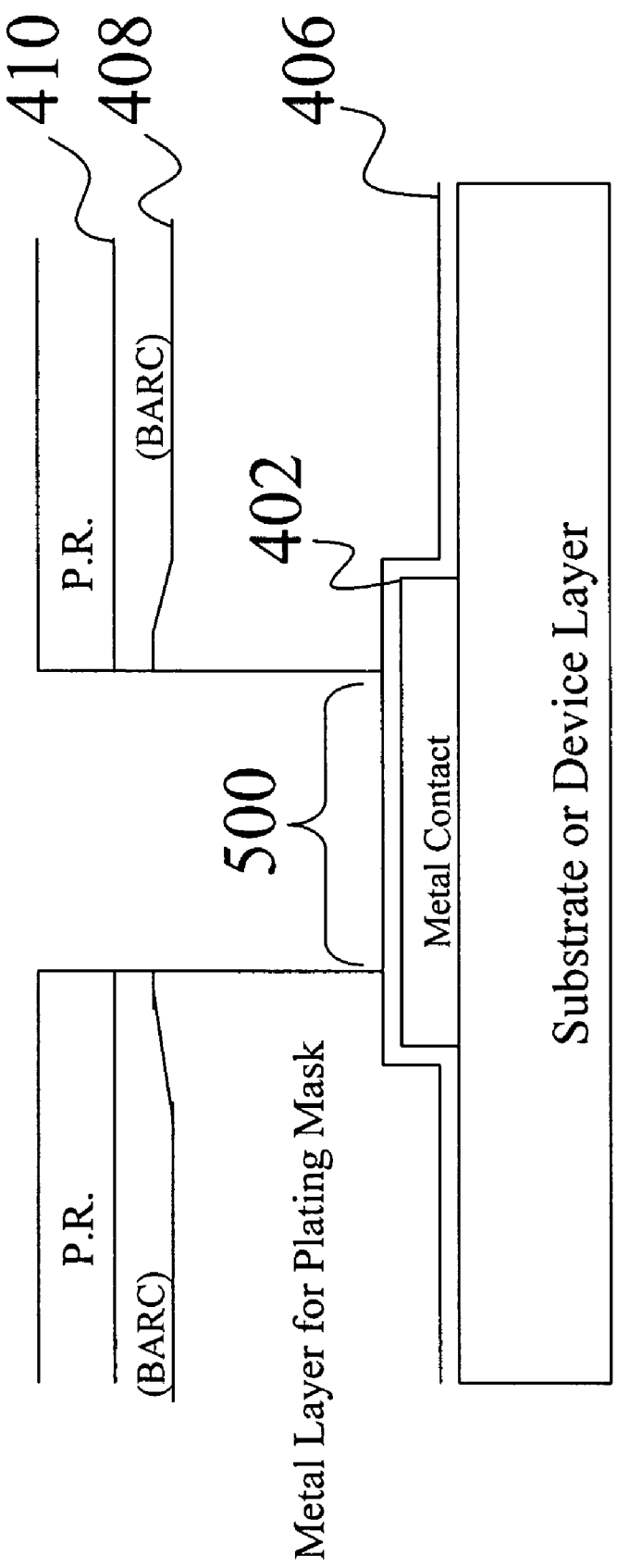
FIG. 5 is an illustration of the interconnect, illustrating a portion of a bottom anti-reflection coating (BARC) and a portion of the metal layer being removed.

As shown in FIG. 5, the BARC 410 and metal mask layer 408 are selectively etched to stop at the top of the seed layer 406, thereby exposing a portion of the seed layer 406 on top of the first contact 402 (i.e., an exposed seed layer 500). The BARC 410 and metal mask layer 408 are selectively etched using any suitable etching technique, non-limiting examples of which include using Inductance-Coupled Plasma (ICP) etch or a buffered oxide etch (BOE). In the case of a scaled version (described further below), especially with sub-micron sized features, ICP is suitable for directional control in etching.

Figure 6:
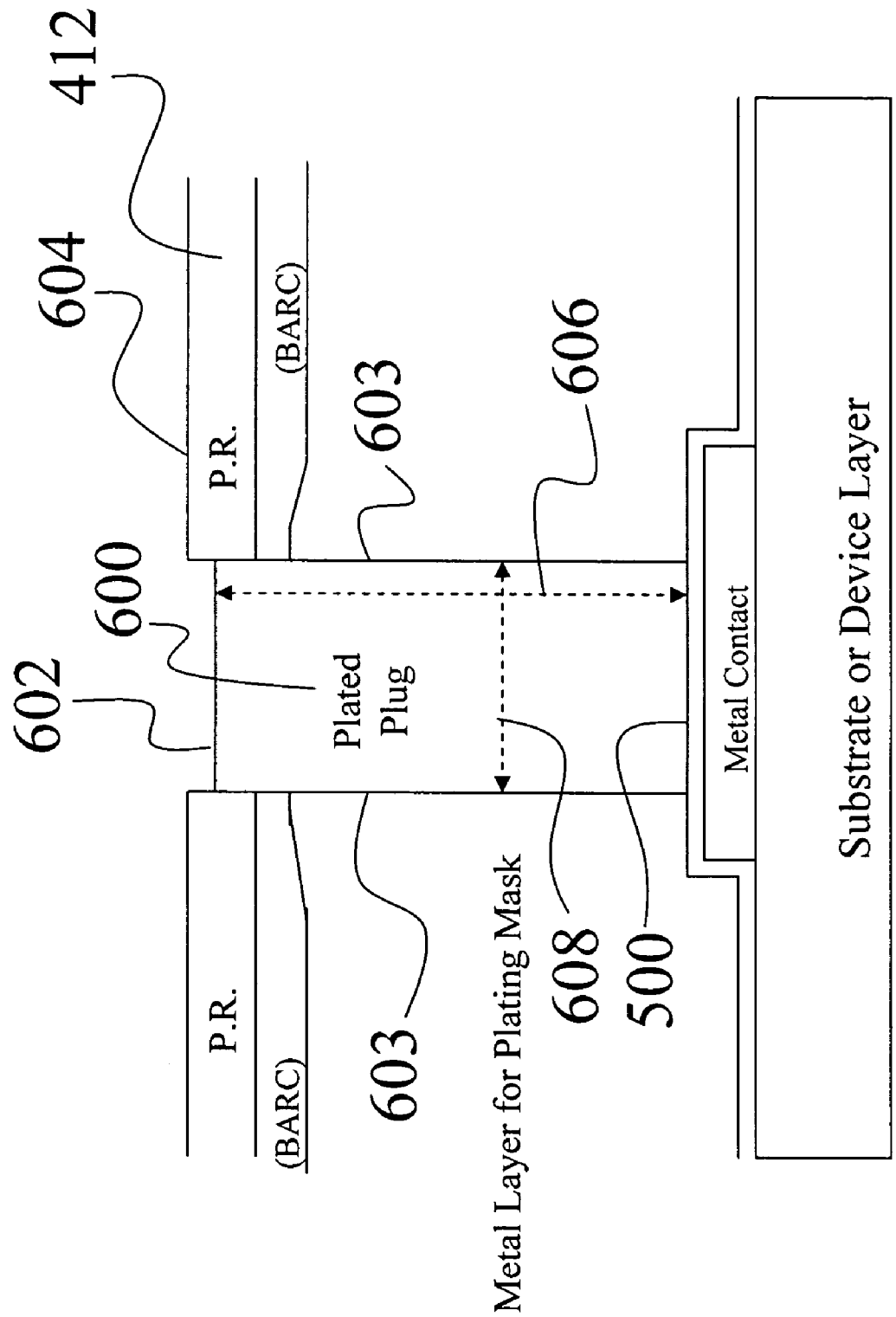
FIG. 6 is an illustration of the formation of the interconnect, with a seed layer being plated to form a plated plug.

As shown in FIG. 6, the exposed seed layer 500 is then plated to form a first plated plug 600. The first plated plug 600 is formed through any suitable plating process, such as electro-plating. In one aspect, the first plated plug 600 includes a top portion 602 separating two substantially parallel (vertical) side walls 603. The first plated plug 600 is formed such that the top portion 602 is below a top level 604 of the photo resist 412. Additionally, the plated plug 600 can be formed of any suitably conductive material, such as plated gold. Further, the plated plug 600 is formed such that its width can be above one micrometer ($\mu$m), or sub micron for various needs of metal interconnect in ICs. In one aspect, it is desirable that the plated plug 600 be formed such that the aspect ratio of plated plug height 606 to width 608 is greater than two. In another aspect, it is desirable that the plated plug 600 has a width that is less than 0.3 microns.

Figure 7:
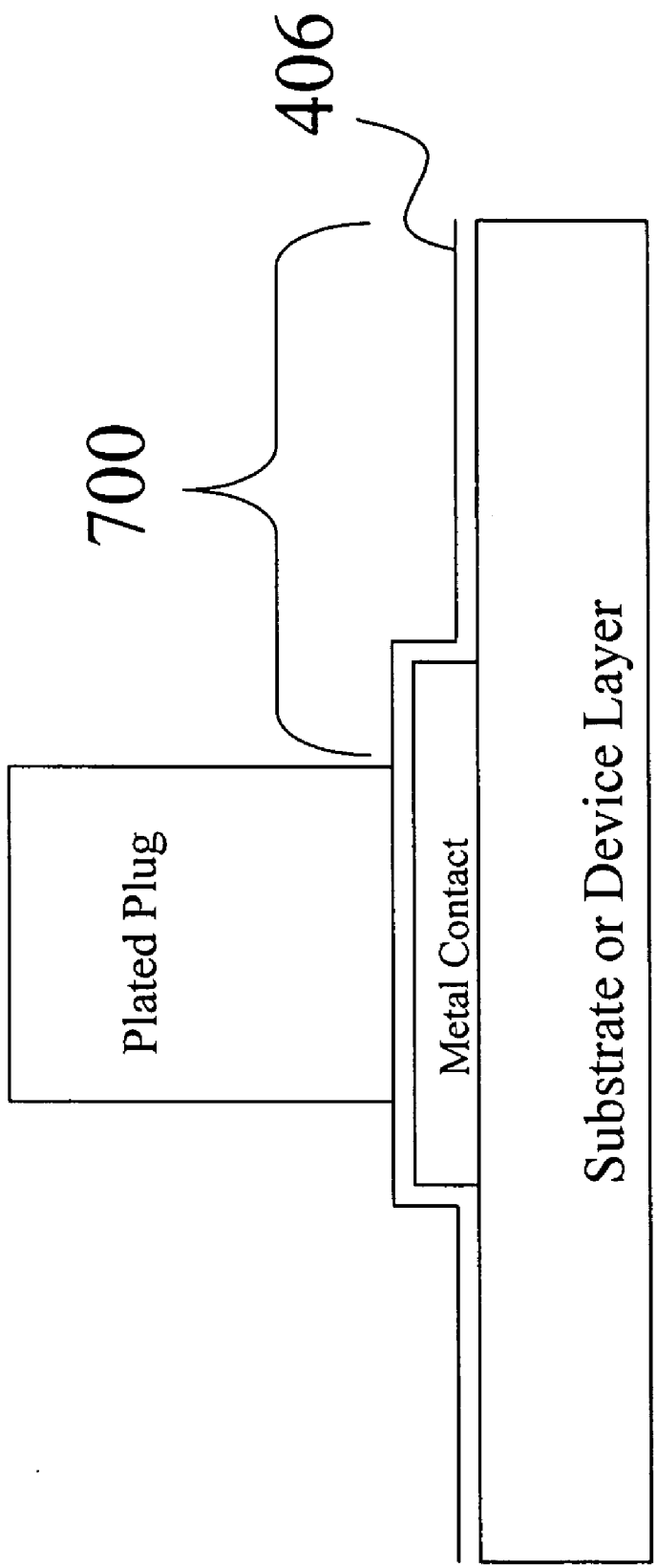
FIG. 7 is an illustration the interconnect, illustrating a photoresist (P.R.), the BARC, and the metal layer being removed.

As shown in FIG. 7, the photoresist layer, the BARC and the metal mask layer are removed (e.g., sequentially) to expose an unplated portion 700 of the seed layer 406. The layers are removed using any suitable removal technique, or combination thereof, non-limiting examples of which include photoresist striping, oxygen dry etching, and BOE.

Figure 8:
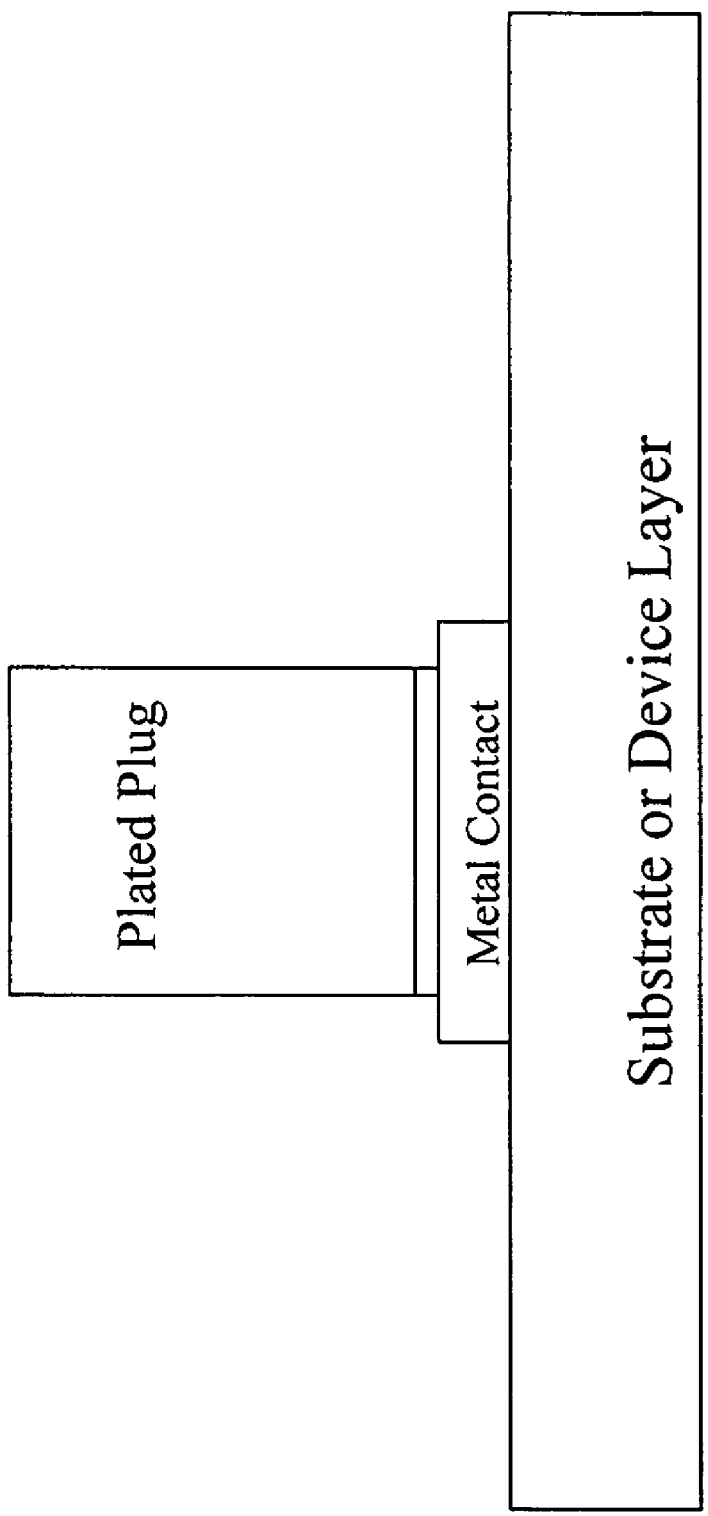
FIG. 8 is an illustration of the interconnect, illustrating the seed layer being removed.

As shown in FIG. 8, the unplated portion of the seed layer is then removed using any suitable technique. As a non-limiting example, the unplated portion of the seed layer is removed by ion milling or by a combination of ion milling and ICP (depending on the seed layer material).

Figure 9:
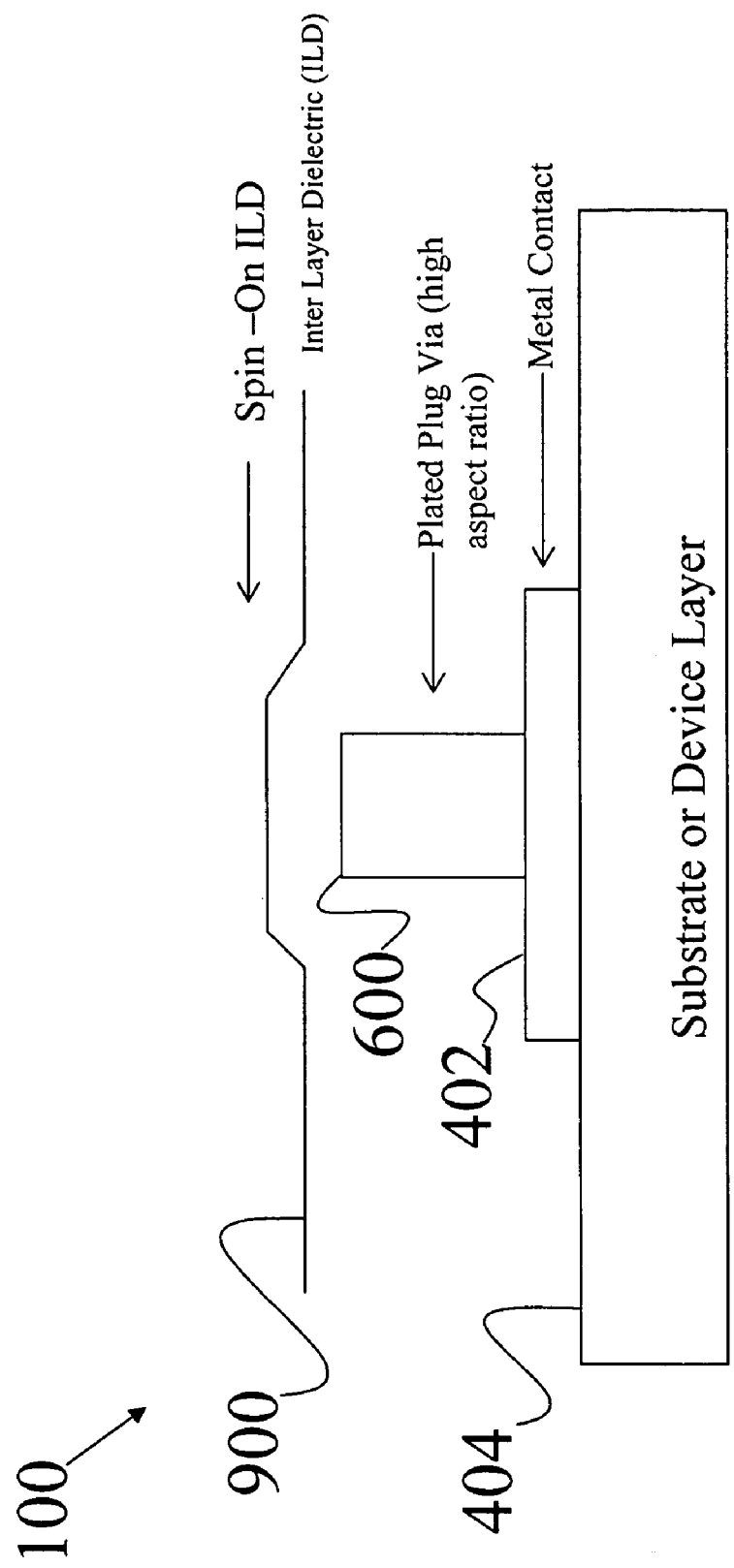
FIG. 9 is an illustration of the interconnect, illustrating an addition of an inter-layer dielectric (ILD)

As shown in FIG. 9, an ILD 900 is then deposited on the interconnect 100 using any suitable ILD deposition technique. As a non-limiting example, the ILD 900 can be a spin-on ILD or coated using a track system. In any case, the ILD 900 is coated on the interconnect 100 such that it covers at least a portion of the first plated plug 600, the first contact 402, and/or the substrate 404.

Figure 10:
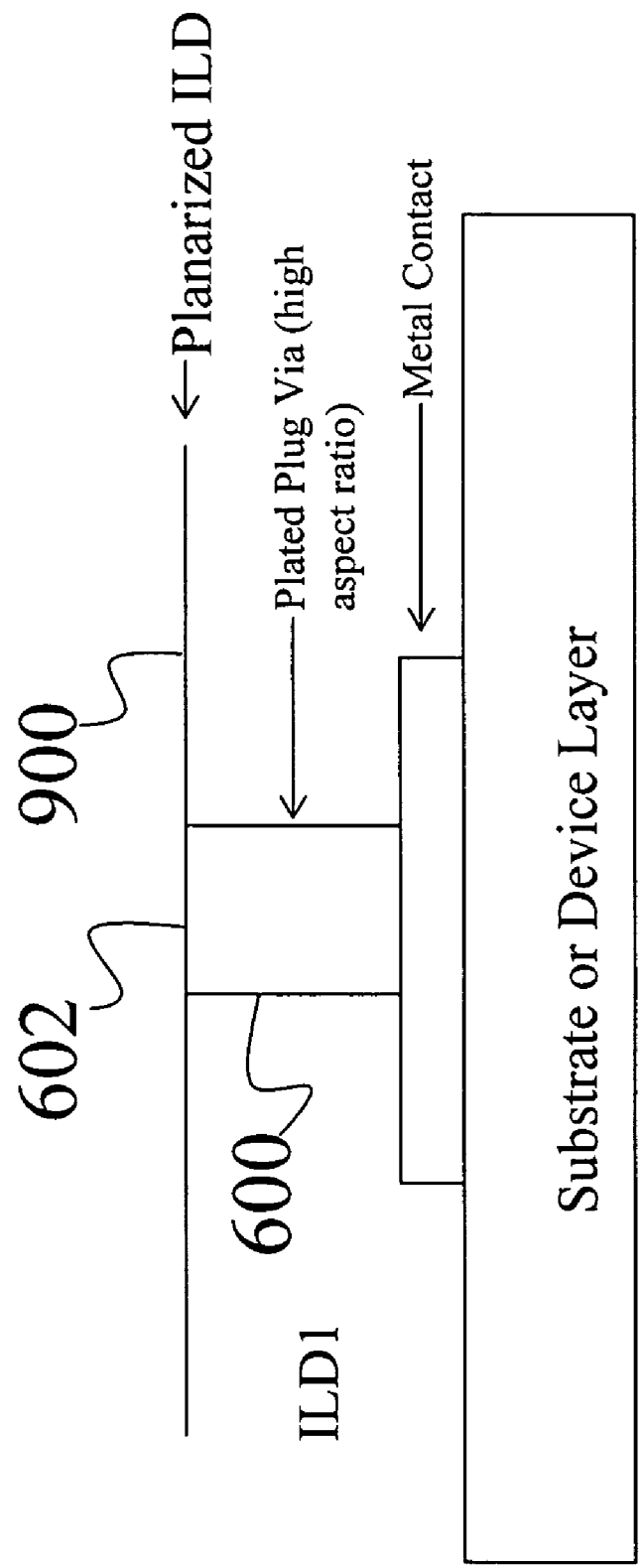
FIG. 10 is an illustration of the interconnect, illustrating the ILD being planarized and a top portion of the plated plug being exposed.

As shown in FIG. 10, the ILD 900 is planarized and etched back to expose the top portion 602 of the first plated plug 600. The ILD 900 is etched back using any suitable etching technique, a non-limiting example of which includes ICP with $O_2$ or $CF_4/O_2$.

Figure 11:
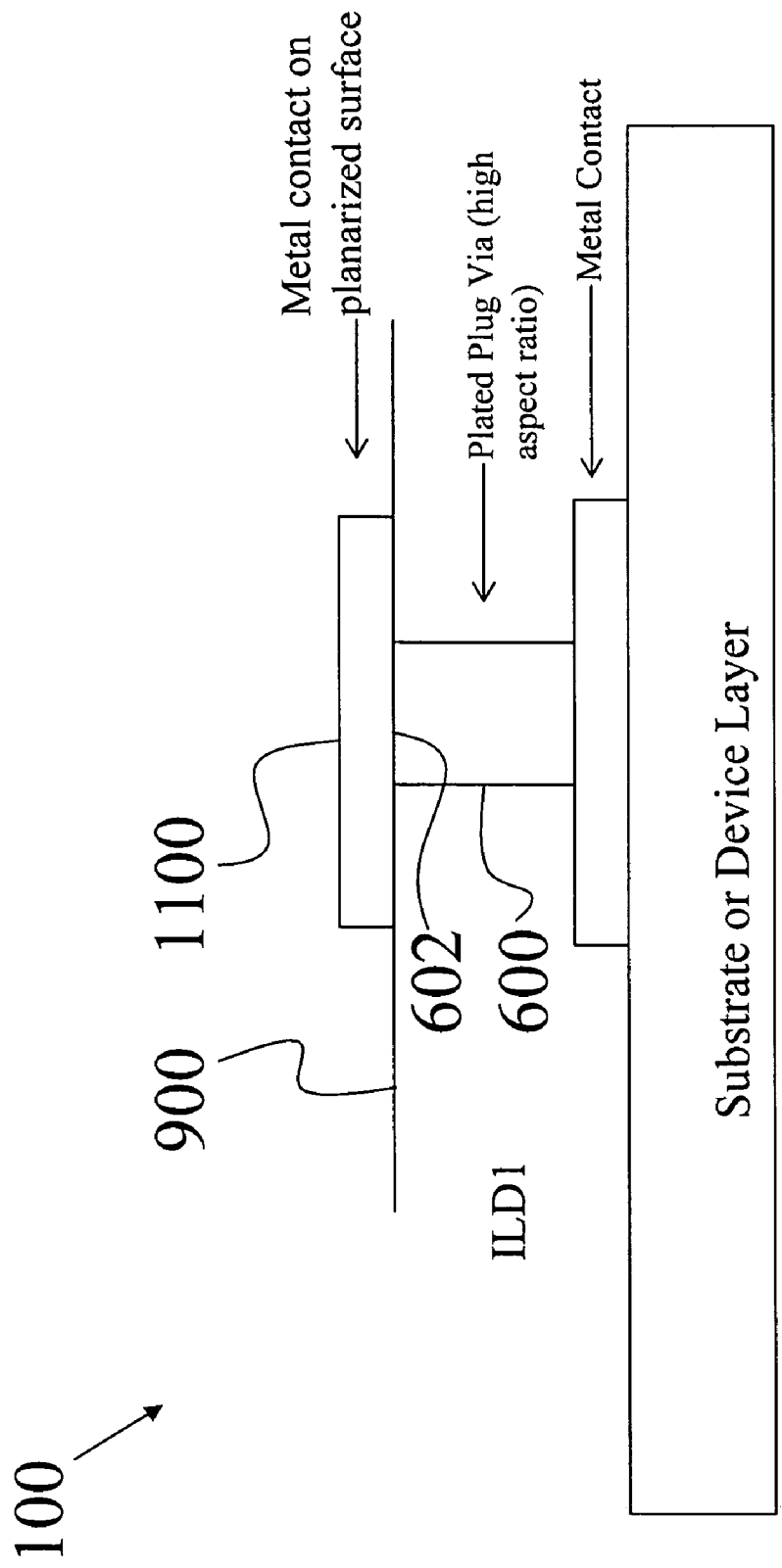
FIG. 11 is an illustration of the interconnect, illustrating an addition of a second contact on the ILD.

As shown in FIG. 11, once the ILD 900 is planarized, a second contact 1100 is deposited on the top portion 602 of the first plated plug 600, thereby forming the interconnect 100 with a plated plug 600 via.

As discussed above, the present invention can be formed as an interconnect with stacked via. As can be appreciated by one skilled in the art, there are a variety of forms by which the via can be stacked. For illustrative purposes, FIGS. 12-16 illustrate the formation of a second layer of stacked via.

Figure 12:
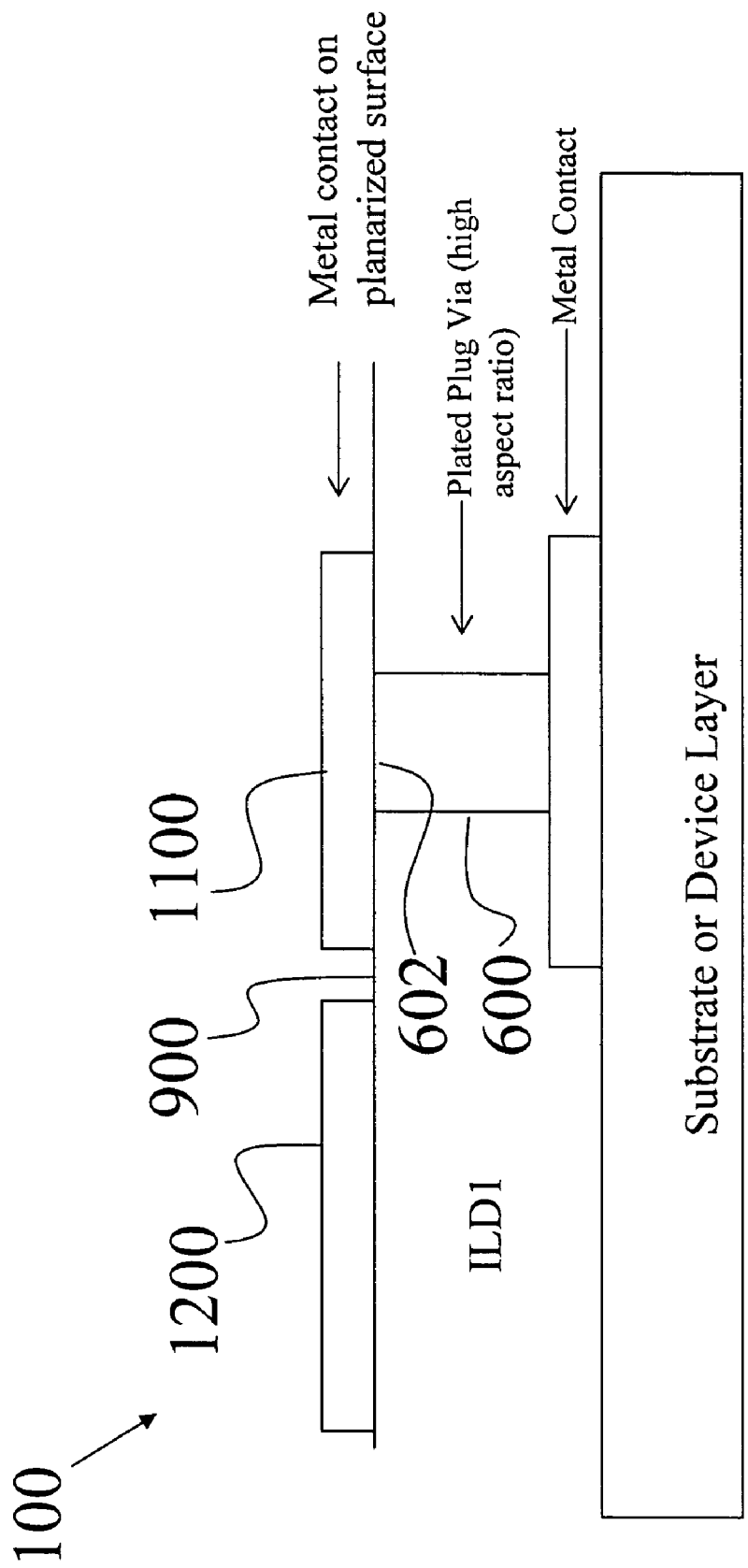
FIG. 12 is an illustration of the interconnect, illustrating an addition of a third contact on the ILD.

As shown in FIG. 12, a third contact 1200 is deposited on the planarized ILD 900 such that the third contact 1200 is electrically separate from the second contact 1100.

As can be appreciated by one skilled in the art, the acts described above and illustrated in FIGS. 4-8 are repeated to form a second plated plug and third plated plug on the second and third contacts, respectively. For example, a second seed layer is deposited such that it covers a portion of the second contact, the third contact, and the ILD. A second metal mask layer is thereafter deposited on the second seed layer. Next, a second bottom anti-reflection coating (BARC) is deposited on the second metal mask layer. A second photoresist layer is then formed on the second BARC. A portion of the second photoresist layer is removed such that a gap exists in the second photoresist layer above the second contact and the third contact. The second BARC and the second metal mask layer are etched back to expose portions of the second seed layer on the second contact and on the third contact. The portion of the second seed layer that is exposed on the second contact is an exposed second contact seed layer, while the portion of the second seed layer that is exposed on the third contact is an exposed third contact seed layer. Each of the exposed second contact seed layer and the exposed third contact seed layer are plated to form a second plated plug and a third plated plug, respectively. Each of the second plated plug and the third plated plug have a top portion. The second photoresist layer, the second BARC, and the second metal mask layer are removed (e.g., sequentially) to expose an unplated portion of the second seed layer. The unplated portion of the second seed layer is thereafter removed to form the stacked configuration illustrated in FIG. 13.

Figure 13:
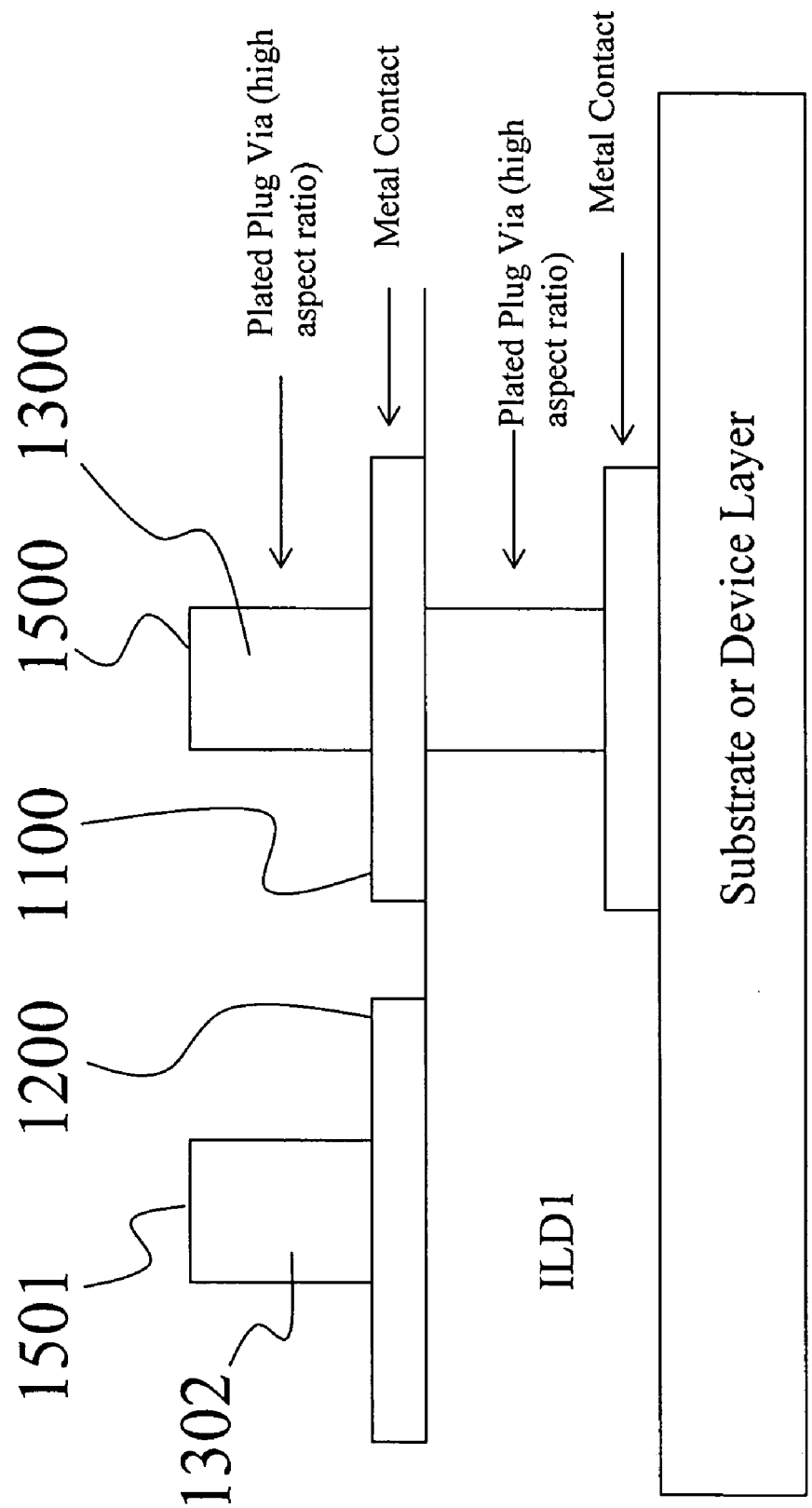
FIG. 13 is an illustration of the interconnect, illustrating the formation of a second and third plated plug via.

As shown in FIG. 13, the second plated plug 1300 is formed on top of the second contact 1100, while the third plated plug 1302 is formed on top of the third contact 1200. As briefly mentioned above, the second plated plug 1300 has a top portion 1500 while the third plated plug 1302 has its own top portion 1501.

Figure 14:
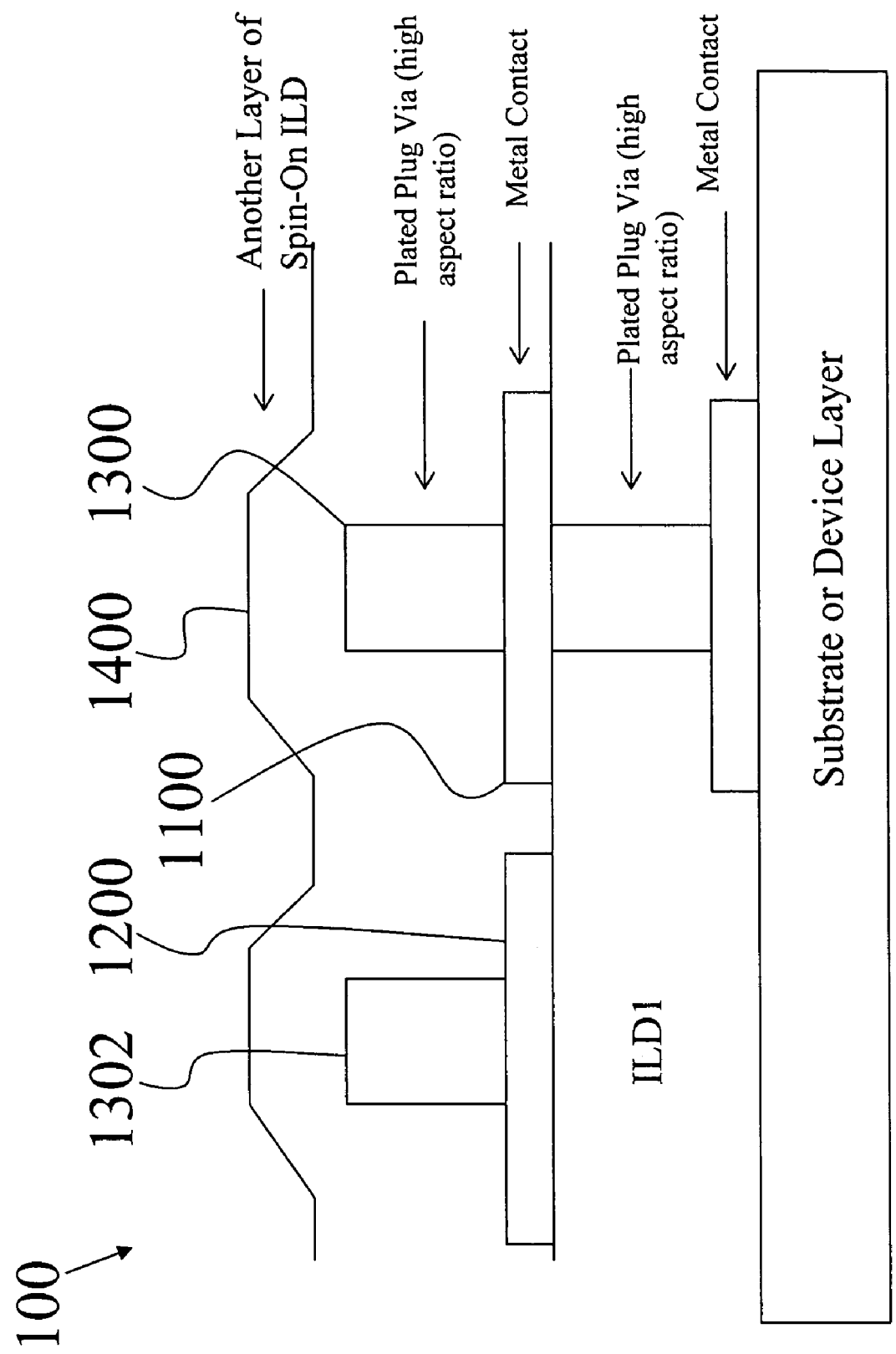
FIG. 14 is an illustration of the interconnect, illustrating an addition of a second inter-layer dielectric (ILD2)

As shown in FIG. 14, another layer of spin-on ILD (i.e., the second ILD 1400) is deposited on the interconnect 100 such that it covers at least a portion of the second plated plug 1300, the second contact 1100, the third plated plug 1302, and/or the third contact 1200.

Figure 15:
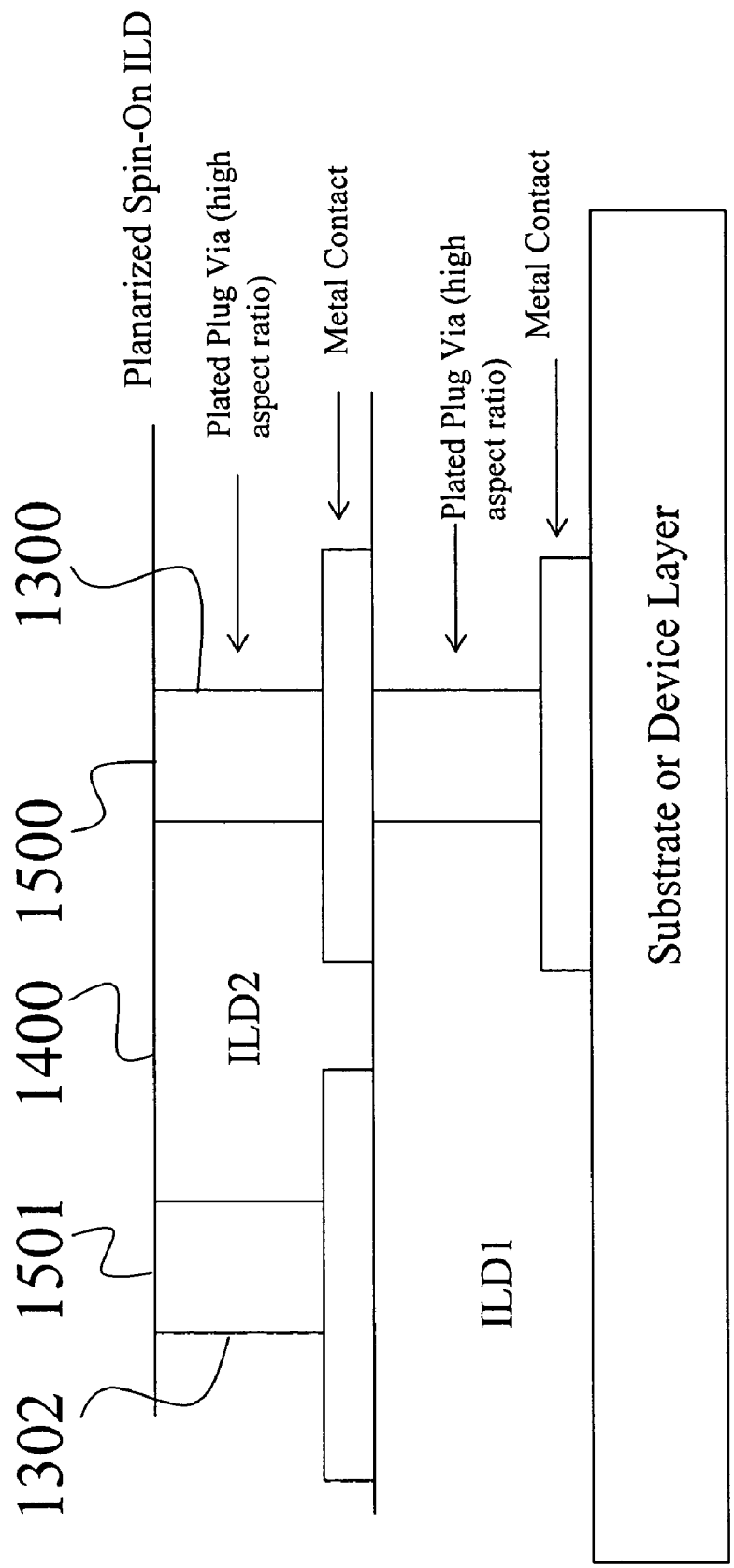
FIG. 15 is an illustration of the interconnect, illustrating the planarization of the ILD2 and a top portion of the second and third plated plug vias being exposed.

As shown in FIG. 15, the second ILD 1400 is planarized by etching back the ILD to expose the top portions 1500 and 1501 of each of the second plated plug 1300 and the third plated plug 1302, respectively.

Figure 16:
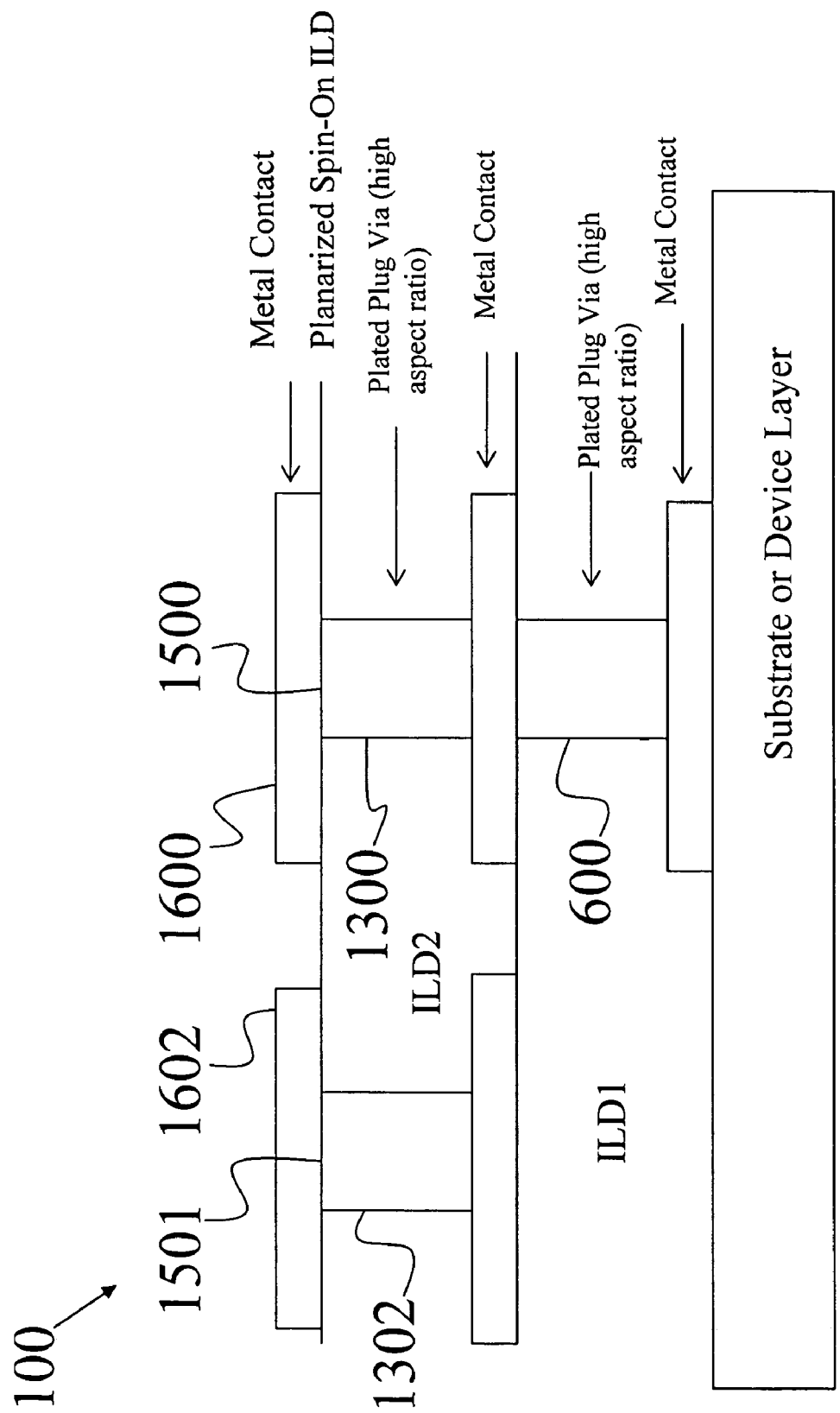
FIG. 16 is an illustration of the interconnect, illustrating an addition of a fourth and fifth contact, with the second plated plug being a stacked via.

Finally, as shown in FIG. 16, a fourth contact 1600 and fifth contact 1602 are formed on the interconnect 100. The fourth contact 1600 is deposited on the top portion 1500 of the second plated plug 1300, while the fifth contact 1602 is deposited on the top portion 1501 of the third plated plug 1302. As clearly shown in FIG. 16, the second and third plated plugs 1300 and 1302 are on a different level than the first plated plug 600, thereby forming an interconnect with multiple levels of plated plug via. Also as shown, the second plated plug 1300 is formed above the first plated plug 600, forming stacked, plugged via.

This structure is not limited to a two-level interconnect because the acts above can be repeated to build additional levels. It should be noted that because of the good dimensional control and high aspect ratio of the plugged via, interconnects with higher densities and more levels can be realized. This provides IC designers more flexibility when designing high-performance, low-power, and low-parasitic circuits.

What is claimed is:

1. A method for forming an interconnect, comprising acts of:
    depositing a first contact on a substrate;
    depositing a seed layer on the substrate such that it covers a portion of both the first contact and the substrate;
    depositing a mask layer on the seed layer;
    depositing a bottom anti-reflection coating (BARC) on the mask layer;
    forming a photoresist layer on the BARC;
    removing a portion of the photoresist layer such that a gap exists above the first contact;
    removing at least a portion of the BARC and the mask layer to expose a portion of the seed layer on the first contact, the portion of the seed layer being an exposed seed layer;
    forming a first plated plug on the exposed seed layer, the first plated plug being formed to have a top portion;
    removing at least a portion of the photoresist layer, the BARC, and the mask layer to expose an unplated portion of the seed layer;
    removing the unplated portion of the seed layer;
    depositing an inter layer dielectric (ILD) on the interconnect such that it covers at least a portion of the first plated plug, the first contact, and the substrate;
    removing at least a portion of the ILD to expose the top portion of the first plated plug; and
    depositing a second contact on the top portion of the first plated plug, thereby forming an interconnect with a plated plug via.

2. A method as set forth in claim 1, wherein in the act of removing a portion of the photoresist layer, the photoresist layer is removed using optical lithography.

3. A method as set forth in claim 2, wherein in the act of forming a first plated plug on the exposed seed layer, the exposed seed layer is plated such that the plated plug has a width that is less than 0.3 microns.

4. A method as set forth in claim 3, wherein in the act of forming a first plated plug on the exposed seed layer, the plated plug is formed such that it has a top portion separating two substantially parallel side walls.

5. A method as set forth in claim 4, further comprising an act of forming a second plated plug connected with the first plated plug.

6. A method as set forth in claim 5, wherein the act of forming the second plated plug further comprises acts of:
    depositing a second seed layer such that it covers a portion of both the second contact and the ILD;
    depositing a second mask layer on the second seed layer;
    depositing a second bottom anti-reflection coating (BARC) on the second mask layer;
    forming a second photoresist layer on the second BARC;
    removing a portion of the second photoresist layer such that a gap exists above the second contact;
    removing at least a portion of the second BARC and the second mask layer to expose a portion of the second seed layer on the second contact, the portion of the second seed layer being an exposed second seed layer;
    forming a second plated plug on the exposed second seed layer, the second plated plug being formed to have a top portion;
    removing at least a portion of the second photoresist layer, the second BARC, and the second mask layer to expose an unplated portion of the second seed layer; and
    removing the unplated portion of the second seed layer,
    depositing a second inter layer dielectric (second ILD) on the interconnect such that it covers at least a portion of the second plated plug and the second contact;
    removing at least a portion of the second ILD to expose the top portion of the second plated plug; and
    depositing a third contact on the top portion of the second plated plug, thereby forming a stacked interconnect with multiple levels of plated plug vias.

7. A method as set forth in claim 4, further comprising an act of forming a second plated plug and a third plated plug, such that the second plated plug is electrically connected with and stacked on top of the first plated plug and the third plated plug is electrically separate from the first and second plated plugs.

8. A method as set forth in claim 7, wherein the act of forming the second plated plug and the third plated plug further comprises acts of:
    depositing a third contact on the ILD such that the third contact is electrically separate from the second contact;

depositing a second seed layer such that it covers a portion of the second contact, the third contact, and the ILD;

depositing a second mask layer on the second seed layer;

depositing a second bottom anti-reflection coating (BARC) on the second mask layer;

forming a second photoresist layer on the second BARC;

removing a portion of the second photoresist layer such that a gap exists in the second photoresist layer above the second contact and the third contact;

removing at least a portion of the second BARC and the second mask layer to expose portions of the second seed layer on the second contact and on the third contact, the portion of the second seed layer that is exposed on the second contact being an exposed second contact seed layer, and the portion of the second seed layer that is exposed on the third contact being an exposed third contact seed layer;

forming a second plated plug and a third plated plug on the exposed second contact and exposed third contact seed layers, respectively, each of the second plated plug and the third plated plug having a top portion;

removing at least a portion of the second photoresist layer, the second BARC, and the second mask layer to expose an unplated portion of the second seed layer; and removing the unplated portion of the second seed layer, depositing a second inter layer dielectric (second ILD) on the interconnect such that it covers at least a portion of the second plated plug, the second contact, the third plated plug, and the third contact;

removing at least a portion of the second ILD to expose the top portions of each of the second plated plug and the third plated plug;

depositing a fourth contact on the top portion of the second plated plug;

depositing a fifth contact on the top portion of the third plated plug, thereby forming an interconnect with multiple levels of plated plug via.

9. A method as set forth in claim 1, wherein in the act of forming a first plated plug on the exposed seed layer, the exposed seed layer is plated such that the plated plug has a width that is less than 0.3 microns.

10. A method as set forth in claim 1, wherein in the act of forming a first plated plug on the exposed seed layer, the plated plug is formed such that it has a top portion separating two substantially parallel side walls.

11. A method as set forth in claim 1, further comprising an act of forming a second plated plug that is connected with and stacked on top of the first plated plug.

12. A method as set forth in claim 11, wherein the act of forming the second plated plug further comprises acts of:

depositing a second seed layer such that it covers a portion of both the second contact and the ILD;

depositing a second mask layer on the second seed layer;

depositing a second bottom anti-reflection coating (BARC) on the second mask layer;

forming a second photoresist layer on the second BARC;

removing a portion of the second photoresist layer such that a gap exists above the second contact;

removing at least a portion of the second BARC and the second mask layer to expose a portion of the second seed layer on the second contact, the portion of the second seed layer being an exposed second seed layer;

forming a second plated plug on the exposed second seed layer, the second plated plug being formed to have a top portion;

removing at least a portion of the second photoresist layer, the second BARC, and the second mask layer to expose an unplated portion of the second seed layer; and removing the unplated portion of the second seed layer, depositing a second inter layer dielectric (second ILD) on the interconnect such that it covers at least a portion of the second plated plug and the second contact;

removing at least a portion of the second ILD to expose the top portion of the second plated plug; and depositing a third contact on the top portion of the second plated plug, thereby forming a stacked interconnect with multiple levels of plated plug vias.

13. A method as set forth in claim 1, further comprising an act of forming a second plated plug and a third plated plug, such that the second plated plug is electrically connected with and stacked on top of the first plated plug and the third plated plug is electrically separate from the first and second plated plugs.

14. A method as set forth in claim 13, wherein the act of forming the second plated plug and the third plated plug further comprises acts of:

depositing a third contact on the ILD such that the third contact is electrically separate from the second contact;

depositing a second seed layer such that it covers a portion of the second contact, the third contact, and the ILD;

depositing a second mask layer on the second seed layer;

depositing a second bottom anti-reflection coating (BARC) on the second mask layer;

forming a second photoresist layer on the second BARC;

removing a portion of the second photoresist layer such that a gap exists in the second photoresist layer above the second contact and the third contact;

removing at least a portion of the second BARC and the second mask layer to expose portions of the second seed layer on the second contact and on the third contact, the portion of the second seed layer that is exposed on the second contact being an exposed second contact seed layer, and the portion of the second seed layer that is exposed on the third contact being an exposed third contact seed layer;

forming a second plated plug and a third plated plug on the exposed second contact and exposed third contact seed layers, respectively, each of the second plated plug and the third plated plug having a top portion;

removing at least a portion of the second photoresist layer, the second BARC, and the second mask layer to expose an unplated portion of the second seed layer; and removing the unplated portion of the second seed layer, depositing a second inter layer dielectric (second ILD) on the interconnect such that it covers at least a portion of the second plated plug, the second contact, the third plated plug, and the third contact;

removing at least a portion of the second ILD to expose the top portions of each of the second plated plug and the third plated plug;

depositing a fourth contact on the top portion of the second plated plug;

depositing a fifth contact on the top portion of the third plated plug, thereby forming an interconnect with multiple levels of plated plug via.

15. An interconnect as formed according to the method of claim 1.

16. An interconnect as formed according to the method of claim 2.

17. An interconnect as formed according to the method of claim 3.

18. An interconnect as formed according to the method of claim 4.

19. An interconnect as formed according to the method of claim 5.

20. An interconnect as formed according to the method of claim 6.

21. An interconnect as formed according to the method of claim 7.

22. An interconnect as formed according to the method of claim 8.

23. An interconnect as formed according to the method of claim 9.

24. An interconnect as formed according to the method of claim 10.

25. An interconnect as formed according to the method of claim 11.

26. An interconnect as formed according to the method of claim 12.

27. An interconnect as formed according to the method of claim 13.

28. An interconnect as formed according to the method of claim 14.

29. A method for forming an interconnect, comprising acts of:

depositing a first contact on a substrate;

depositing a seed layer on the substrate such that it covers a portion of both the first contact and the substrate;

depositing a mask layer on the seed layer;

depositing a bottom anti-reflection coating (BARC) on the mask layer;

forming a photoresist layer on the BARC;

removing a portion of the photoresist layer such that a gap exists above the first contact;

removing at least a portion of the BARC and the mask layer to expose a portion of the seed layer on the first contact, the portion of the seed layer being an exposed seed layer;

forming a first plated plug on the exposed seed layer, the first plated plug being formed to have a top portion;

removing at least a portion of the photoresist layer, the BARC, and the mask layer to expose an unplated portion of the seed layer; and removing the unplated portion of the seed layer;

depositing an inter layer dielectric (ILD) on the interconnect such that it covers at least a portion of the first plated plug, the first contact, and the substrate;

removing at least a portion of the ILD to expose the top portion of the first plated plug;

depositing a second contact on the top portion of the first plated plug, thereby forming an interconnect with a plated plug via; and wherein in the act of forming a first plated plug on the exposed seed layer, the plated plug possesses a height and a width, with a height/width aspect ratio that is greater than two.

30. An interconnect as formed according to the method of claim 29.

* * * * *